United States Patent
Ikeda (10) Patent No.: US 6,373,782 B1
(45) Date of Patent: Apr. 16, 2002

(54) SEMICONDUCTOR DEVICE WITH REDUCED ERROR OPERATION CAUSED BY THRESHOLD VOLTAGE VARIATION

(75) Inventor: Yutaka Ikeda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/778,783

(22) Filed: Feb. 8, 2001

(30) Foreign Application Priority Data

Sep. 4, 2000 (JP) ......................................... 2000-266612

(51) Int. Cl.$^7$ .............................. G11C 8/06; H03F 3/45
(52) U.S. Cl. ............................ 365/230.08; 365/189.05; 365/210; 365/208; 365/207; 365/190; 365/233; 365/191; 365/193; 365/230.06; 365/230.08; 327/55; 327/53; 327/56; 327/52
(58) Field of Search ............................ 365/189.05, 207, 365/208, 210, 190, 233, 193, 191, 230.08, 230.06; 327/55, 53, 54, 52, 56, 51

(56) References Cited

U.S. PATENT DOCUMENTS 5,708,688 A * 1/1998 Ting et al. ..................... 377/33
5,729,160 A * 3/1998 Allan ........................... 327/54
5,982,705 A * 11/1999 Tsukikawa ............... 365/230.08

FOREIGN PATENT DOCUMENTS

| JP | 55-149510 | 11/1980 | ............ H03F/3/45 |
| JP | 9-74340 | 3/1997 | ............ H03K/5/08 |

* cited by examiner

Primary Examiner—Andrew Q. Tran
(74) Attorney, Agent, or Firm—McDermott, Will & Emery (57) ABSTRACT

An output circuit is driven by a first differential amplification circuit having an N-channel differential amplification stage that compares a reference voltage VREF with an input signal IN, and a second differential amplification circuit having a P-channel differential stage. An output of the first differential amplification circuit is given as the gate voltage of P-channel MOS transistors in the output circuit, and an output of the second differential amplification circuit is given as the gate voltage of N-channel MOS transistors in the output circuit. This realizes an input buffer with reduced error operations even under threshold voltage variations caused by process variations and others.

7 Claims, 6 Drawing Sheets

SEMICONDUCTOR DEVICE WITH REDUCED ERROR OPERATION CAUSED BY THRESHOLD VOLTAGE VARIATION

BACKGROUND OF THE INVENTION

1. Field of the Invention

The present invention relates to a semiconductor device, and more particularly to a semiconductor device including an input buffer that receives a signal from outside to transmit the signal to an internal circuit.

2. Description of the Background Art

A semiconductor device includes an input buffer that receives a signal input from outside. A conventional input buffer is constructed with a differential amplification circuit of a current mirror load and an inverter.

Figure 8:
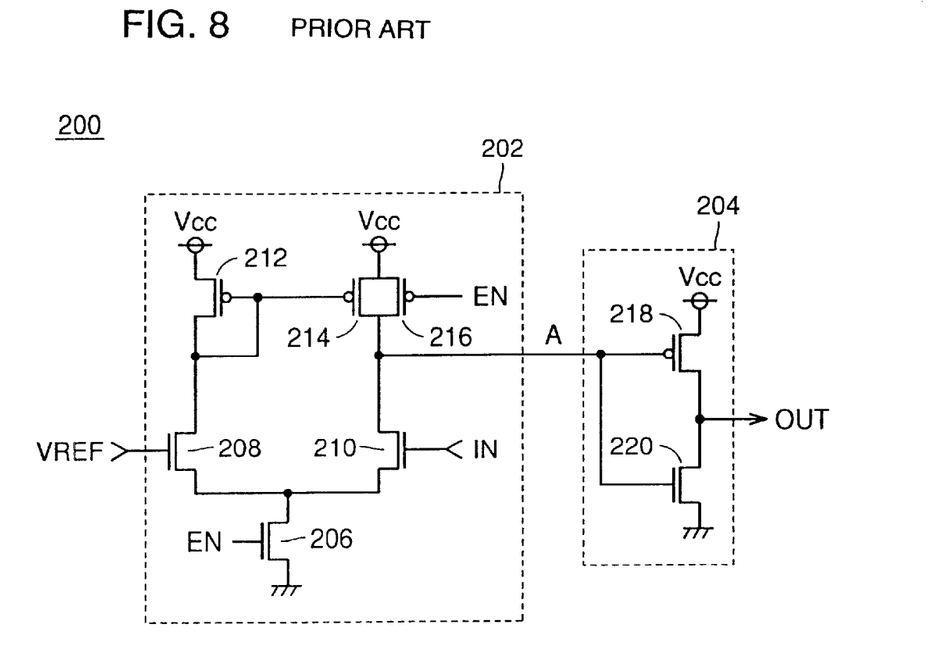
FIG. 8 is a circuit diagram illustrating a construction of a conventional input buffer 200.

FIG. 8 is a circuit diagram showing a construction of a conventional input buffer 200.

Referring to FIG. 8, the input buffer 200 includes a differential amplification circuit 202 that is activated in accordance with a signal EN and compares a reference voltage VREF with an input signal IN, and an inverter 204 that receives and inverts an output of the differential amplification circuit 202 and outputs an output signal OUT.

The differential amplification circuit 202 includes an N-channel MOS transistor 206 whose gate receives the signal EN and whose source is connected to a ground node, and an N-channel MOS transistor 208 whose gate receives the reference voltage VREF and whose source is connected to the drain of the N-channel MOS transistor 206.

The differential amplification circuit 202 further includes an N-channel MOS transistor 210 whose gate receives the input signal IN and whose source is connected to the drain of the N-channel MOS transistor 206, and a P-channel MOS transistor 212 whose gate and drain are connected to the drain of the N-channel MOS transistor 208 and whose source is connected to a power supply voltage Vcc.

The differential amplification circuit 202 further includes a P-channel MOS transistor 214 whose gate is connected to the drain of the N-channel MOS transistor 208 and which is connected between the node to which the power supply voltage Vcc is given and the drain of the N-channel MOS transistor 210, and a P-channel MOS transistor 216 whose gate receives the signal EN and which is connected between the power supply node and the drain of the N-channel MOS transistor 210. An output signal A of the differential amplification circuit 202 is output from the drain of the N-channel MOS transistor 210.

The inverter 204 includes a P-channel MOS transistor 218 and an N-channel MOS transistor 220 both of which receive a signal A at the gates thereof and which are connected in series between the power supply node and the ground node. An output signal OUT is output from the connection node of the P-channel MOS transistor 218 and the N-channel MOS transistor 220.

When the signal EN is raised to a H-level, the N-channel MOS transistor 206 is brought into a conducted state while the P-channel MOS transistor 216 is brought into a non-conducted state. Then, the differential amplification circuit 202 is activated and, if the input signal IN is higher than the reference voltage VREF, the differential amplification circuit 202 outputs a L-level to the signal A, whereas if the input signal IN is lower than the reference voltage VREF, the differential amplification circuit 202 outputs a H-level as the signal A.

However, regarding the amplitude of the output signal of the differential amplification circuit, it is not always the case that the H-level is the power supply voltage Vcc and the L-level is the ground voltage. There are cases in which the H-level of the output signal is lower than the power supply voltage Vcc or the L-level is higher than the ground voltage.

Figure 9:
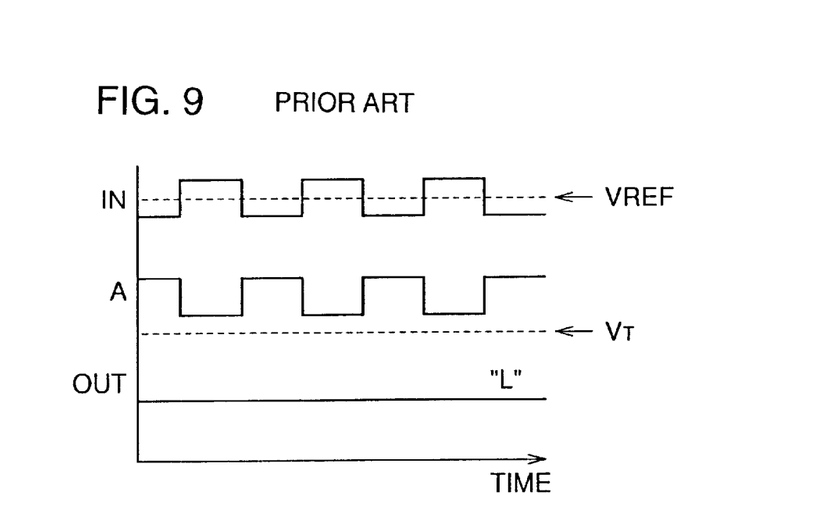
FIG. 9 is a waveform diagram for explaining an error operation of the input buffer.

FIG. 9 is a waveform diagram for explaining an error operation of the input buffer.

Referring to FIGS. 8 and 9, the input signal IN is repeatedly at a higher voltage or at a lower voltage than the reference voltage VREF and, in accordance therewith, the output signal A of the differential amplification circuit 202 alternately outputs the H-level and the L-level. However, since the L-level of the signal A is higher than a threshold voltage Vt of the inverter 204, the signal A does not cross over the threshold voltage of the inverter. Then, the output signal OUT of the inverter is fixed at the L-level.

Such a phenomenon occurs, for example, when the reference voltage VREF is low and, in such a case, it is difficult to raise the output of the differential amplification circuit above the threshold voltage of the inverter, thereby causing an error operation in which the output of the inverter remains invariable.

The threshold voltage of the inverter may change depending on production variations and, if the threshold value of the inverter changes, there is a problem of decrease in the production yield.

SUMMARY OF THE INVENTION

An object of the present invention is to provide a semiconductor device including an input buffer that does not easily raise an error operation even under threshold voltage variations of the inverter caused by production variations.

In summary, the present invention is directed to a semiconductor device including an input buffer circuit and an internal circuit.

The input buffer circuit receives a first input signal from outside. The input buffer circuit includes first and second differential amplification circuits and an output circuit. The first differential amplification circuit compares a voltage given by the input signal with a reference voltage and outputs complementary first and second output signals in which a high level of an output voltage is a power supply voltage and a low level is a first intermediate voltage between the power supply voltage and a ground voltage. The second differential amplification circuit compares the voltage given by the first input signal with the reference voltage and outputs complementary third and fourth output signals in which a low level of an output voltage is the ground voltage and a high level is a second intermediate voltage between the power supply voltage and the ground voltage. The output circuit outputs complementary fifth and sixth output signals in accordance with the first to fourth output signals.

The internal circuit operates in accordance with the fifth and sixth output signals.

Therefore, a principal advantage of the present invention lies in that the error operation in which the input signal is not transmitted to the inside can be prevented when the threshold voltage variations occur due to process variations.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereafter, preferred embodiments of the present invention will be described in detail with reference to the attached drawings. Here, like reference numerals in the drawings denote like or corresponding parts.

Figure 1:
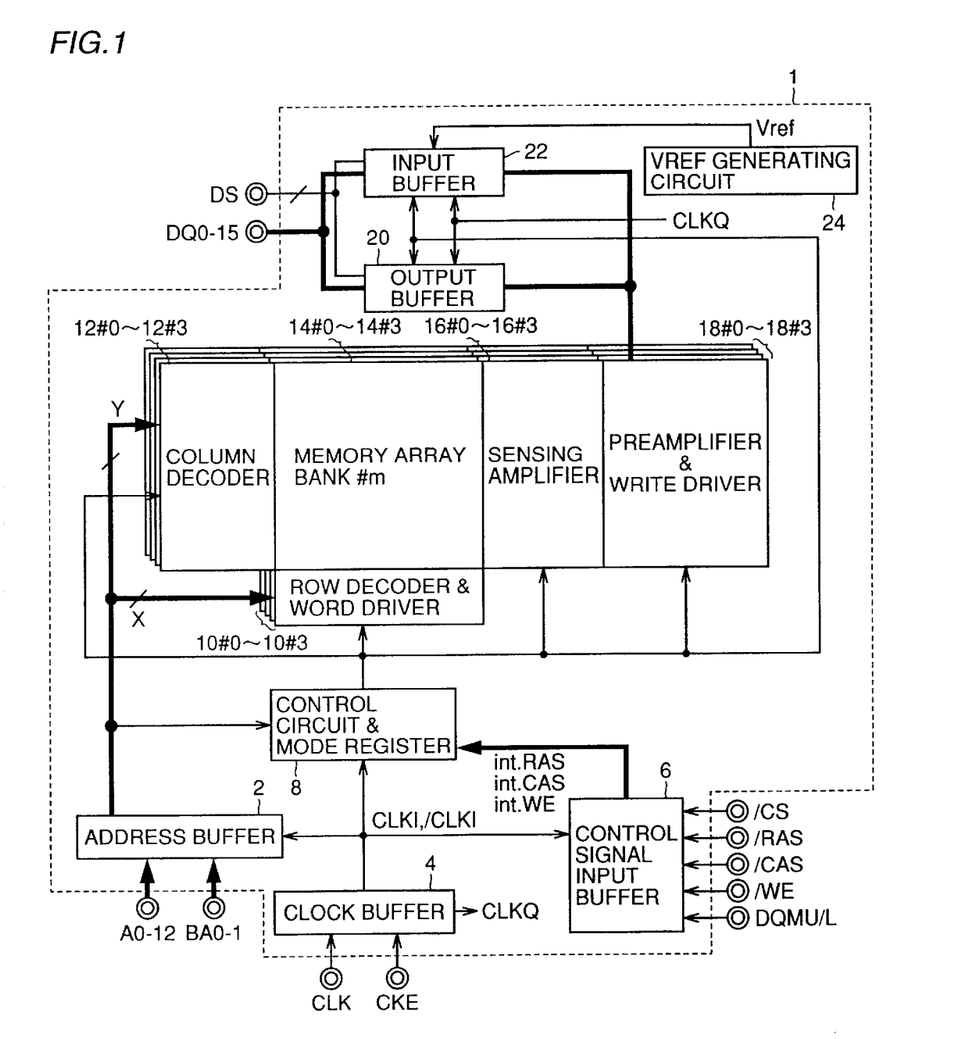
FIG. 1 is a block diagram illustrating a schematic construction of a synchronous semiconductor storage device 1 which is an example of a semiconductor device.

FIG. 1 is a block diagram illustrating a schematic construction of a synchronous semiconductor storage device 1 as an example of a semiconductor device.

Referring to FIG. 1, the synchronous semiconductor storage device 1 includes memory array banks 14#0 to 14#3 each having a plurality of memory cells that are arranged in a matrix configuration; an address buffer 2 that takes in address signals A0 to A12 and bank address signals BA0 to BA1, which are given from the outside, in synchronization with clock signals CLKI, /CLKI and outputs an internal row address, an internal column address, and an internal bank address; a clock buffer 4 that receives a clock signal CLK and a clock enable signal CKE from the outside and outputs clock signals CLKI, /CLKI, and CLKQ used in the inside; and a control signal input buffer 6 that takes in control signals /CS, /RAS, /CAS, /WE, and a mask signal DQMU/L, which are given from the outside, in synchronization with the clock signals CLKI, /CLKI.

The synchronous semiconductor storage device 1 further includes a control circuit that receives an internal address signal from the address buffer 2 and receives control signals int.RAS, int.CAS, int.WE synchronized with the clock signals from the control signal input buffer 6 to output a control signal to each block in synchronization with the clock signals CLKI, /CLKI, and a mode register that holds the operation mode recognized in the control circuit. In FIG. 1, the control circuit and the mode register are represented by one block 8.

The control circuit includes a bank address decoder that decodes internal bank address signals int.BA0, int.BA1, and a command decoder that receives and decodes the control signals int.RAS, int.CAS, int.WE.

The synchronous semiconductor storage device 1 further includes row decoders that are disposed respectively in correspondence with the memory array banks 14#0 to 14#3 and decode a row address signal X given from the address buffer 2, and word drivers for driving an address-designated row (word line) in the inside of the memory array banks 14#0 to 14#3 to a selected state in accordance with the output signals of these row decoders. In FIG. 1, the row decoders and the word drivers are collectively represented by blocks 10#0 to 10#3.

The synchronous semiconductor storage device 1 further includes column decoders 12#0 to 12#3 that decode an internal column address signal Y given from the address buffer 2 to generate a column selection signal, and sensing amplifiers 16#0 to 16#3 that sense and amplify data of the memory cells connected to the selected row of the memory array banks 14#0 to 14#3.

The synchronous semiconductor storage device 1 further includes an input buffer 22 that receives a write data fiom the outside to generate an internal write data, a write driver that amplifies the internal write data from the input buffer 22 and transmits the internal write data to the selected memory cell, a preamplifier that amplifies the data read out from the selected memory cell, and an output buffer 20 that performs a buffer processing on the data from the preamplifier and outputs the data to the outside.

The preamplifier and the write driver are disposed respectively in correspondence with the memory array banks 14#0 to 14#3. In FIG. 1, the preamplifier and the write driver are represented by blocks 18#0 to 18#3 as one block.

The input buffer 22 takes in the data signals DQ0 to DQ15 given from the outside to the terminal in accordance with a strobe signal DS. This strobe signal DS is a signal that constitutes a standard of the time for another semiconductor device or the like, which outputs data to the synchronous semiconductor storage device 1, to take in the data that are output in synchronization with the data. The synchronous semiconductor storage device 1 receives the strobe signal DS, which is transmitted from the outside in parallel with the data and which is given to the terminal, as a standard for taking in the data signals.

The synchronous semiconductor storage device 1 further includes a Vref generating circuit 24 that generates a reference voltage Vre. The reference voltage Vref is input to the input buffer and constitutes a standard for a threshold value in taking in the data.

When the synchronous semiconductor storage device 1 outputs data to the outside, the output buffer 20 outputs the data signals DQ0 to DQ15 in synchronization with the clock signal CLKQ, and outputs to the outside the strobe signal DS for another semiconductor device to take in the data signals.

In such a synchronous semiconductor storage device 1, the clock signal CLK given from the outside is given by being converted by the clock buffer 4 into the clock signals CLKI, /CLKI and CLKQ that are used in the inside. For example, the clock signal CLKQ is given to the input buffer 22 and the output buffer 20; however, the clock delay time till the clock signal CLKQ is transmitted to the input buffer 22 is preferably equal to the clock delay time till the clock signal CLKQ is transmitted to the output buffer 20.

Figure 2:
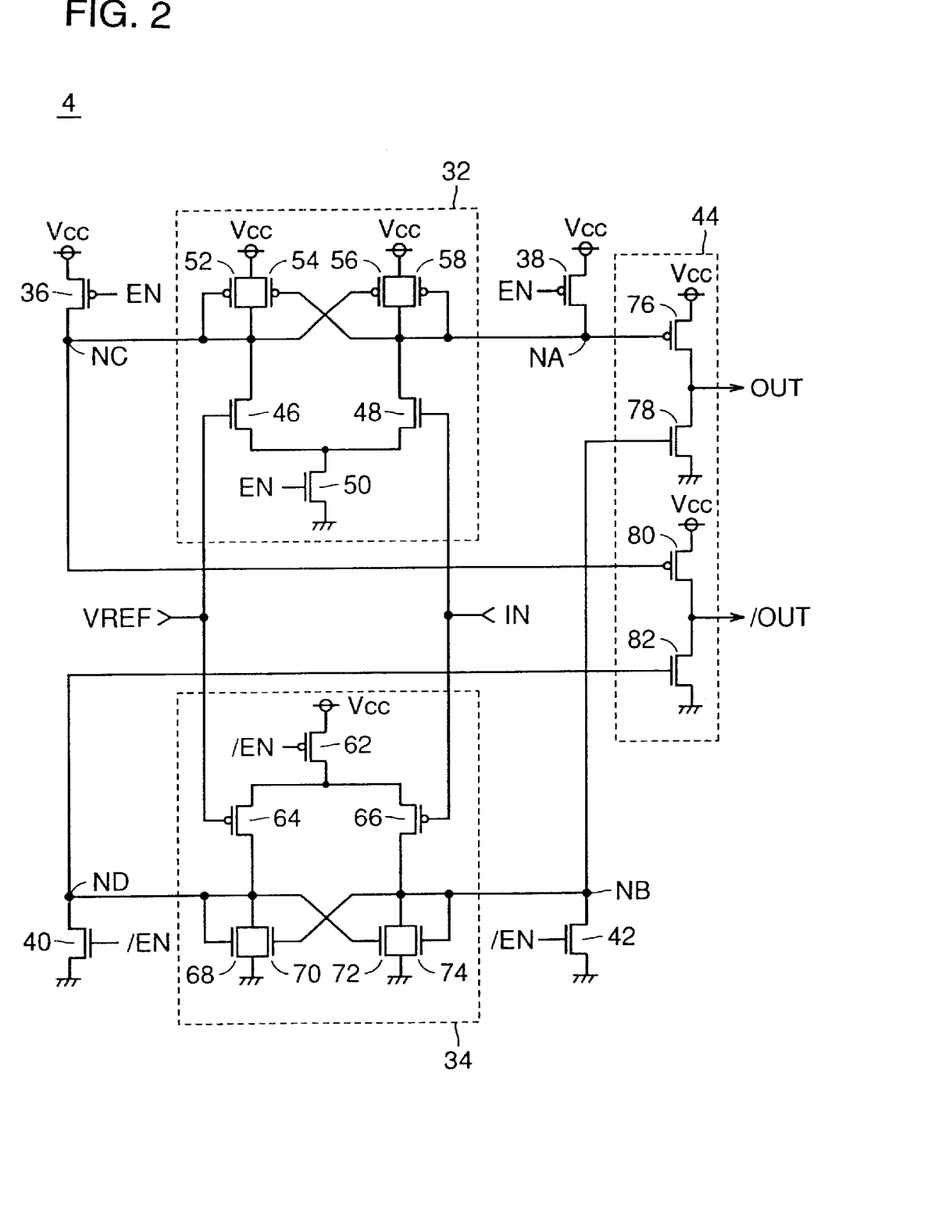
FIG. 2 is a circuit diagram illustrating a construction of a clock buffer 4 in FIG. 1.

FIG. 2 is a circuit diagram illustrating a construction of the clock buffer 4 in FIG. 1.

Referring to FIG. 2, the clock buffer 4 includes a differential amplification circuit 32 that receives a reference voltage VREF and an input signal IN and outputs a differential output to a node NA and a node NC; P-channel MOS transistors 38, 36 for fixing the voltages of the node NA and the node NC to the power supply voltage Vcc in accordance with a signal EN; a differential amplification circuit 34 that receives the reference voltage VREF and the input signal IN and outputs a differential output to a node NB and a node ND; N-channel MOS transistors 42, 40 for fixing the voltages of the nodes NB, ND to the ground voltage in accordance with a signal /EN; and an output circuit 44 that outputs output signals OUT, /OUT in accordance with the voltages of the nodes NA, NB, NC, ND.

The differential amplification circuit 32 includes an N-channel MOS transistor 50 whose gate receives the signal EN and whose source is connected to the ground node, an N-channel MOS transistor 46 whose gate receives the reference voltage VREF and which is connected between the node NC and the drain of the N-channel MOS transistor 50, and an N-channel MOS transistor 48 whose gate receives the input signal IN and which is connected between the node NA and the drain of the N-channel MOS transistor 50.

The differential amplification circuit 32 further includes a P-channel MOS transistor 52 whose gate is connected to the node NC and which is connected between the power supply node and the node NC, a P-channel MOS transistor 54 whose gate is connected to the node NA and which is connected between the power supply node and the node NC, a P-channel MOS transistor 56 whose gate is connected to the node NC and which is connected between the power supply node and the node NA, and a P-channel MOS transistor 58 whose gate is connected to the node NA and which is connected between the power supply node and the node NA.

The P-channel MOS transistor 52 and the P-channel MOS transistor 56 form a first current mirror, and the P-channel MOS transistor 58 and the P-channel MOS transistor 54 form a second current mirror. In other words, the differential amplification circuit 32 uses a current mirror of cross-coupling type as a load of differential amplification.

The differential amplification circuit 34 includes a P-channel MOS transistor 62 whose source is connected to the power supply node and whose gate receives the signal /EN, a P-channel MOS transistor 64 whose gate receives the reference voltage VREF and which is connected between the drain of the P-channel MOS transistor 62 and the node ND, a P-channel MOS transistor 66 whose gate receives the input signal IN and which is connected between the drain of the P-channel MOS transistor 62 and the node NB, an N-channel MOS transistor 68 whose gate and drain are connected to the node ND and whose source is connected to the ground node, an N-channel MOS transistor 70 whose gate is connected to the node NB and which is connected between the node ND and the ground node, an N-channel MOS transistor 72 whose gate is connected to the node ND and which is connected between the node NB and the ground node, and an N-channel MOS transistor 74 whose gate is connected to the node NB and which is connected between the node NB and the ground node.

The output circuit 44 includes a P-channel MOS transistor 76 and an N-channel MOS transistor 78 which are connected in series between the power supply node and the ground node and whose gates are respectively connected to the nodes NA, NB, and a P-channel MOS transistor 80 and an N-channel MOS transistor 82 which are connected in series between the power supply node and the ground node and whose gates are respectively connected to the nodes NC, ND. A signal OUT is output from the connection node of the P-channel MOS transistor 76 and the N-channel MOS transistor 78, and a signal /OUT is output from the connection node of the P-channel MOS transistor 80 and the N-channel MOS transistor 82.

Figure 3:
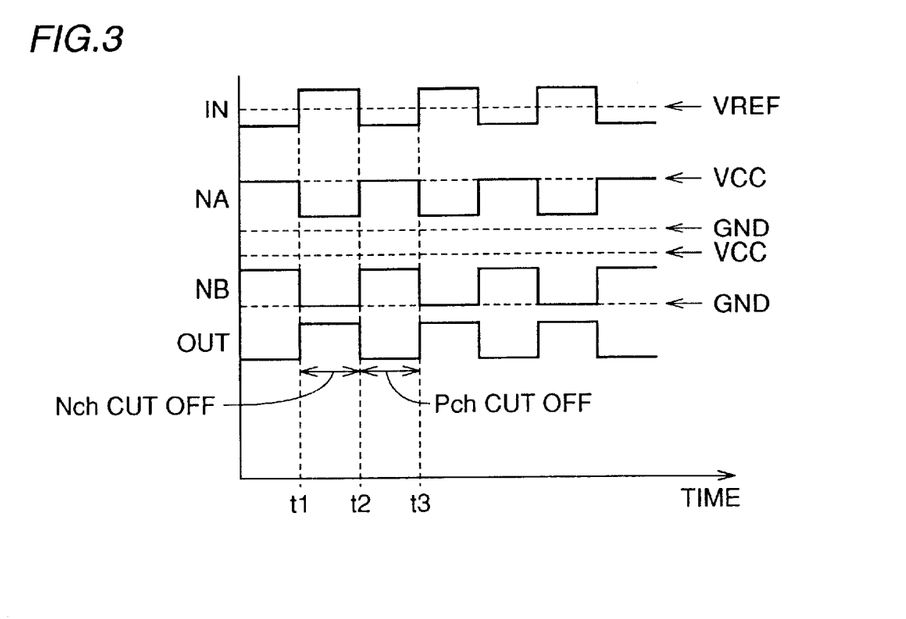
FIG. 3 is an operation waveform diagram for explaining an operation of the clock buffer 4 shown in FIG. 2.

FIG. 3 is an operation waveform diagram for explaining the operation of the clock buffer 4 shown in FIG. 2.

When the voltage of the input signal IN becomes higher than the reference voltage VREF at the time t1, the voltages of the node NA and the node NB come to an L-level. At this time, with respect to the output of the differential amplification circuit 32 of a differential type driven by N-channel MOS transistors, the output amplitude is biased to the vicinity of the power supply voltage Vcc, as shown by the voltage of the node NA.

On the other hand, with respect to the differential amplification circuit 34 of a differential type driven by P-channel MOS transistors, the output amplitude is biased to the vicinity of the ground voltage, as shown by the voltage of the node NB. Therefore, since the voltage of the node NB is at the ground voltage at the time t1 to t2, the N-channel MOS transistor 78 of the output stage can be cut off by inputting this voltage to the N-channel MOS transistor 78.

Subsequently, when the voltage of the input signal IN becomes lower than the reference voltage VREF at the time t2, the voltages of the nodes NA, NB come to a H-level in accordance therewith. In this case, since the voltage of the node NA is equal to the power supply voltage Vcc, the P-channel MOS transistor 76 can be cut off by giving this voltage to the gate of the P-channel MOS transistor 76. Therefore, the input signal can be correctly transmitted to the output signal OUT.

Further, since the differential amplification circuits 32, 34 have respective complementary output signals, a complementary output signal /OUT can be created by giving a signal to the gates of the P-channel MOS transistor 80 and the N-channel MOS transistor 82. With the use of a clock buffer circuit having a construction described above, the output signals OUT, /OUT can be correctly output even if the threshold value of the inverter is varied due to production variations, so that the clock signals CLKI, /CLKI can be correctly generated.

Here, in this embodiment, an example is shown in which the input buffer circuit shown in FIG. 2 is used as a clock buffer; however, the usage is not limited to clock buffers alone, and it can be used as another input buffer that receives an input signal from outside.

Next, explanation will be given on an advantage of the case in which a buffer circuit having such complementary outputs is used.

Figure 4:
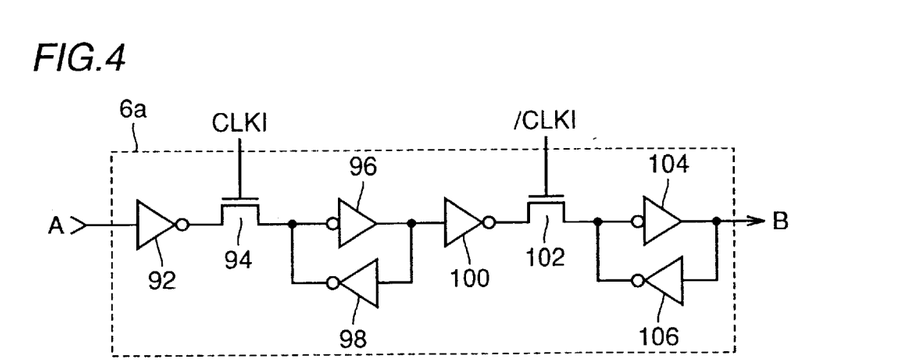
FIG. 4 is a circuit diagram illustrating a construction of a flip-flop 6a which is included in a control signal input buffer 6 in FIG. 1 and which receives a control signal from outside and takes it in with an internal clock.

FIG. 4 is a circuit diagram illustrating a construction of a flip-flop 6a which is included in the control signal input buffer 6 in FIG. 1 and which receives a control signal from outside and takes it in with an internal clock.

Referring to FIG. 4, the flip-flop 6a includes an inverter 92 that receives and inverts an input signal A, an N-channel MOS transistor 94 that transmits an output of the inverter 92 when the clock signal CLKI is at a H-level, an inverter 96 that inverts the output of the inverter 92 transmitted by the N-channel MOS transistor 94, an inverter 98 that feeds an output of the inverter 96 back to an input part of the inverter 96, an inverter 100 that receives and inverts the output of the inverter 96, an N-channel MOS transistor 102 that is conducted in accordance with a clock signal /CLKI and transmits an output of the inverter 100, an inverter 104 that receives and inverts the output of the inverter 100 transmitted by the N-channel MOS transistor 102 and outputs a signal B, and an inverter 106 that feeds an output of the inverter 104 back to an input of the inverter 104.

By supplying complementary clocks with the use of a clock buffer such as shown in FIG. 2, the flip-flop 6a need not incorporate a phase splitter that generates complementary internal clocks from the clock signal. In other words, in many cases, a flip-flop usually incorporates a phase splitter such as an inverter that inverts the clock signal. Therefore, by omitting the inverter, the circuit construction can be simplified.

Figure 5:
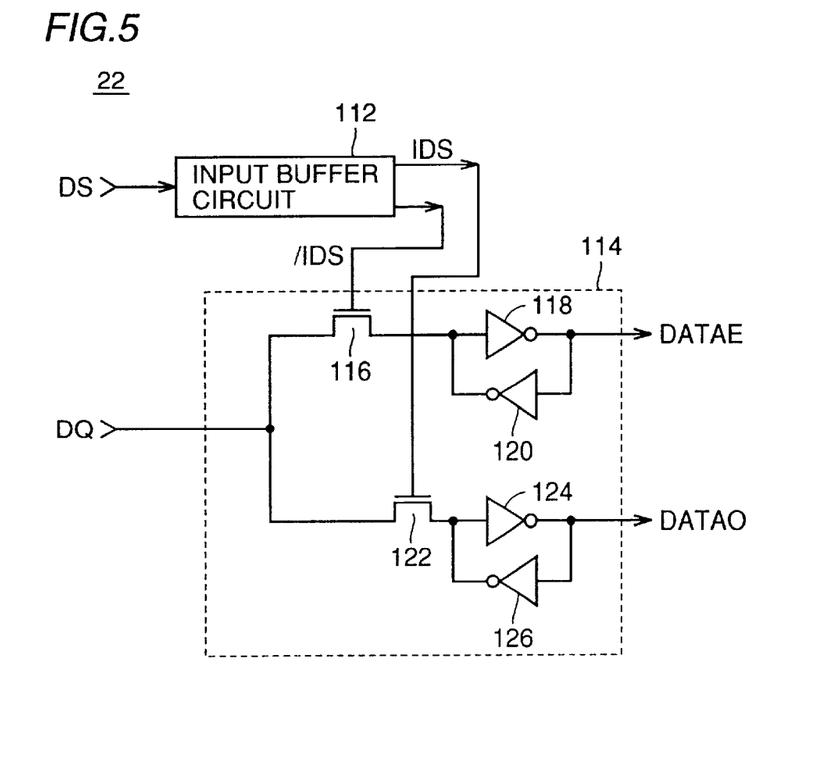
FIG. 5 is a circuit diagram illustrating a construction of an inside of an input buffer 22 in FIG. 1.

FIG. 5 is a circuit diagram illustrating a construction of an inside of the input buffer 22 shown in FIG. 1.

Referring to FIG. 5, the input buffer 22 includes an input buffer circuit 112 that receives the data strobe signal DS and outputs the signals IDS, /IDS, and a latch circuit 114 that takes in the data signal DQ in accordance with the signals IDS, /IDS and outputs an even data signal DATAE and an odd data signal DATAO.

The input buffer circuit 112 has a construction similar to that of the clock buffer 4 shown in FIG. 2, so that an explanation thereof will not be repeated.

The latch circuit 114 includes an N-channel MOS transistor 116 that is conducted in accordance with the signal /IDS and transmits the data signal DQ, an inverter 118 that receives and inverts the signal transmitted by the N-channel MOS transistor 116 and outputs the even data signal DATAE, and an inverter 120 that receives the output of the inverter 118 and feeds the output to an input of the inverter 118.

The latch circuit 114 further includes an N-channel MOS transistor 122 that transmits the data signal DQ in accordance with the signal IDS, an inverter 124 that receives and inverts the data signal DQ transmitted by the N-channel MOS transistor 122 and outputs the odd data signal DATAO, and an inverter 126 that receives the output of the inverter 124 and feeds the output to an input of the inverter 124.

By adopting such a construction, complementary latch signals are supplied to the latch circuit 114, thereby eliminating the need for incorporating a phase splitter in the inside. This can simplify the circuit construction.

Figure 6:
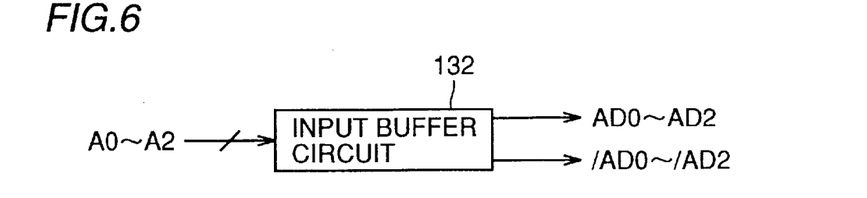
FIG. 6 is a view for explaining a part of an address buffer 2 in FIG. 1.

FIG. 6 is a view for explaining a part of the address buffer 2 shown in FIG. 1.

Referring to FIG. 6, the address buffer 2 includes an input buffer circuit 132 that receives address signals A0 to A2 and outputs complementary signals AD0 to AD2, /AD0 to /AD2. Here, the input buffer circuit 132 includes an input buffer having a construction similar to that of the clock buffer 4 shown in FIG. 2 and corresponding to each of the address signals A0 to A2, so that an explanation thereof will not be repeated.

Figure 7:
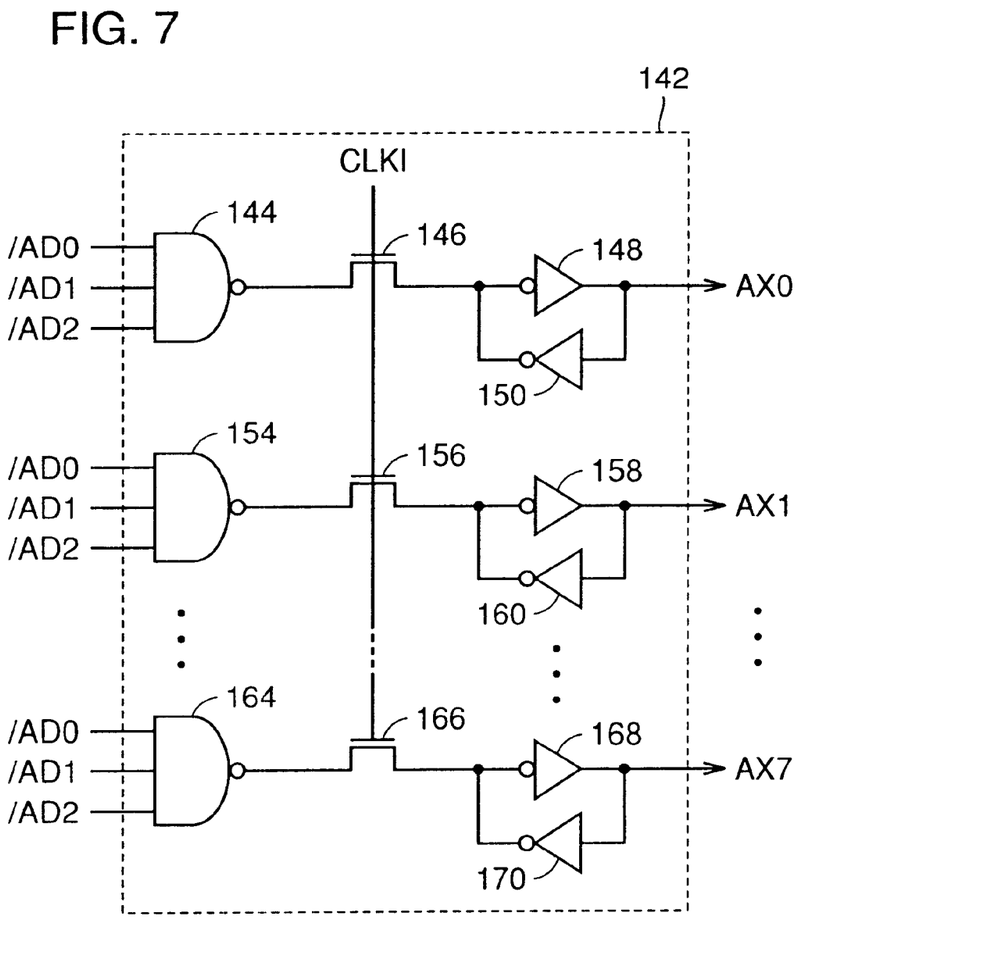
FIG. 7 is a circuit diagram illustrating a construction of a predecoding circuit 142 which is disposed near to a memory array and which predecodes an address.

FIG. 7 is a circuit diagram illustrating a construction of a predecoding circuit 142 which is disposed near to the memory array and which predecodes an address.

Referring to FIG. 7, the predecoding circuit 142 includes a NAND circuit 144 that receives signals /AD0, /AD1, /AD2, an N-channel MOS transistor 146 that is conducted in accordance with the clock signal CLKI and transmits an output of the NAND circuit 144, an inverter 148 that receives and inverts the output of the NAND circuit 144 transmitted by the N-channel MOS transistor 146 and outputs a predecoded signal AX0, and an inverter 150 that receives and inverts an output of the inverter 148 and feeds the output to an input of the inverter 148.

The predecoding circuit 142 further includes a NAND circuit 154 that receives signals AD0, /AD1, /AD2, an N-channel MOS transistor 156 that is conducted in accordance with the clock signal CLKI and transmits an output of the NAND circuit 154, an inverter 158 that receives and inverts the output of the NAND circuit 154 transmitted by the N-channel MOS transistor 156 and outputs a predecoded signal AX1, and an inverter 160 that receives and inverts an output of the inverter 158 and feeds the output to an input of the inverter 158.

The predecoding circuit 142 further includes a NAND circuit 164 that receives signals AD0, AD1, AD2, an N-channel MOS transistor 166 that is conducted in accordance with the clock signal CLKI and transmits an output of the NAND circuit 164, an inverter 168 that receives and inverts the output of the NAND circuit 164 transmitted by the N-channel MOS transistor 166 and outputs a predecoded signal AX7, and an inverter 170 that receives and inverts an output of the inverter 168 and feeds the output to an input of the inverter 168.

Here, although not illustrated, the predecoding circuit 142 further includes circuits that output predecoded signals AX2 to AX6 in accordance with the output of the input buffer circuit 132.

As described above, by inputting an address signal with the use of a construction such as shown in FIGS. 6 and 7, the address can be predecoded at a high speed before it is latched with the clock signal, thereby raising a speed of the address signal processing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
an input buffer circuit that receives a first input signal, said input buffer circuit including:
a first differential amplification circuit comparing a voltage given by said first input signal with a reference voltage and outputting complementary first and second output signals in which a high level of an output voltage is a power supply voltage and a low level is a first intermediate voltage between said power supply voltage and a ground voltage,
a second differential amplification circuit comparing the voltage given by said first input signal with said reference voltage and outputting complementary third and fourth output signals in which a low level of an output voltage is said ground voltage and a high level is a second intermediate voltage between said power supply voltage and said ground voltage,
an output circuit outputting complementary fifth and sixth output signals in accordance with said first to fourth output signals; and
an internal circuit operating in accordance with said fifth and sixth output signals.

2. The semiconductor device according to claim 1, wherein said output circuit includes:
a first P-channel MOS transistor and a first N-channel MOS transistor respectively receiving at their gates said first and third output signals and connected in series between a power supply node to which said power supply voltage is given and a ground node to which said ground voltage is given; and
a second P-channel MOS transistor and a second N-channel MOS transistor respectively receiving at their gates said second and fourth output signals and connected in series between said power supply node and said ground node.

3. The semiconductor device according to claim 2, wherein
said first input signal is a clock signal, and
said internal circuit includes
a first latch circuit that takes in a second input signal in accordance with said fifth output signal, and
a second latch circuit that takes in an output of said first latch circuit in accordance with said sixth output signal.

4. The semiconductor device according to claim 2, wherein
　said input buffer circuit receives a data strobe signal as said first input signal,
　said internal circuit includes a data input buffer circuit that takes in data signal from outside in accordance with said data strobe signal, and
　said data input buffer circuit includes:
　　a first and second gate circuits that transmit said data signal in accordance with said fifth and sixth output signals respectively; and
　　first and second latch circuits that respectively hold transmitted data signals by said first and second gate circuits,
　　said semiconductor device further including a memory array that receives and stores said data signals held by said first and second latch circuits.

5. The semiconductor device according to claim 2, wherein
　said input buffer circuit receives an address signal as said first input signal,
　said internal circuit includes a predecoding circuit that predecodes said address signal, and
　said predecoding circuit includes:
　　a plurality of NAND circuits each of which receives either one of said fifth and sixth output signals;
　　a plurality of gate circuits that respectively transmit outputs of said plurality of NAND circuits in accordance with a clock signal; and
　　a plurality of latch circuits that hold the outputs of said plurality of NAND circuits respectively transmitted by said plurality of gate circuits,
　　said semiconductor device further including a memory array for reading out data by specifying a position of a memory cell in accordance with outputs of said plurality of latch circuits.

6. The semiconductor device according to claim 2, wherein
　said first differential amplification circuit includes:
　　a first N-channel MOS transistor having its source connected to said ground node,
　　a second N-channel MOS transistor having its gate receiving said first input signal and connected between a drain of said first N-channel MOS transistor and a first internal node to which said first output signal is output,
　　a third N-channel MOS transistor having its gate receiving said reference voltage and connected between the drain of said first N-channel MOS transistor and a second internal node to which said second output signal is output,
　　a first P-channel MOS transistor having its gate connected to said second internal node and connected between said first internal node and said power supply node, and
　　a second P-channel MOS transistor having its drain and gate connected to said second internal node and source connected to said power supply node; and
　said second differential amplification circuit includes:
　　a third P-channel MOS transistor having its source connected to said power supply node,
　　a fourth P-channel MOS transistor having its gate receiving said first input signal and connected between a drain of said third P-channel MOS transistor and a third internal node to which said third output signal is output,
　　a fifth P-channel MOS transistor having its gate receiving said reference voltage and connected between the drain of said third P-channel MOS transistor and a fourth internal node to which said fourth output signal is output,
　　a fourth N-channel MOS transistor having its gate connected to said fourth internal node and connected between said third internal node and said ground node, and
　　a fifth N-channel MOS transistor having its drain and gate connected to said fourth internal node and source connected to said ground node.

7. The semiconductor device according to claim 6, wherein
　said first differential amplification circuit further includes:
　　a sixth P-channel MOS transistor having its gate and drain connected to said first internal node and source connected to said power supply node, and
　　a seventh P-channel MOS transistor having its gate connected to said first internal node and connected between said second internal node and said power supply node; and
　said second differential amplification circuit further includes:
　　a sixth N-channel MOS transistor having its gate and drain connected to said third internal node and source connected to said ground node, and
　　a seventh N-channel MOS transistor having its gate connected to said third internal node and connected between said fourth internal node and said ground node.

* * * * *